(12) United States Patent
O'Brien et al.

(10) Patent No.: US 8,184,460 B2
(45) Date of Patent: May 22, 2012

(54) SOLAR INVERTER AND CONTROL METHOD

(75) Inventors: Kathleen Ann O'Brien, Niskayuna, NY (US); Ralph Teichmann, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 442 days.

(21) Appl. No.: 12/473,700

(22) Filed: May 28, 2009

(65) Prior Publication Data
US 2010/0302819 A1   Dec. 2, 2010

(51) Int. Cl.
H02M 7/44 (2006.01)
(52) U.S. Cl. .......................................... 363/97
(58) Field of Classification Search ............. 363/55, 363/56.01, 95, 97, 98, 123, 131; 307/52
See application file for complete search history.

(56) References Cited

U.S. PATENT DOCUMENTS

| | | | |
|---|---|---|---|
| 5,389,158 A | 2/1995 | Fraas et al. | |
| 6,111,767 A * | 8/2000 | Handleman | 363/95 |
| 6,339,538 B1 * | 1/2002 | Handleman | 363/95 |
| 7,072,194 B2 * | 7/2006 | Nayar et al. | 363/71 |
| 7,227,278 B2 * | 6/2007 | Realmuto et al. | 307/44 |
| 7,986,062 B2 * | 7/2011 | Jakeman et al. | 307/151 |
| 8,018,748 B2 * | 9/2011 | Leonard | 363/95 |
| 2005/0063115 A1 * | 3/2005 | Nayar et al. | 361/82 |
| 2006/0174939 A1 | 8/2006 | Matan | |
| 2008/0150366 A1 | 6/2008 | Adest et al. | |
| 2008/0238195 A1 | 10/2008 | Shaver et al. | |
| 2009/0000654 A1 * | 1/2009 | Rotzoll et al. | 136/244 |
| 2009/0014050 A1 | 1/2009 | Haaf | |
| 2009/0015071 A1 | 1/2009 | Iwata et al. | |
| 2009/0121549 A1 | 5/2009 | Leonard | |
| 2010/0073969 A1 * | 3/2010 | Rajagopalan et al. | 363/37 |
| 2010/0157632 A1 * | 6/2010 | Batten et al. | 363/74 |
| 2011/0109346 A1 * | 5/2011 | Moussaoui et al. | 327/60 |

OTHER PUBLICATIONS

Michael Frisch and Temesi Ernö; "High Efficient Topologies for Next Generation Solar Inverter"; Available from Internet<www.bodospower.com>; Aug. 2008; Electronics in Motion and Conversion; 6 pages.

* cited by examiner

*Primary Examiner* — Adolf Berhane
(74) *Attorney, Agent, or Firm* — Ann M. Agosti

(57) ABSTRACT

A power generation system including a photovoltaic (PV) module to generate direct current (DC) power is provided. The system includes a controller to determine a maximum power point for the power generation system and a boost converter for receiving control signals from the controller to boost the power from the PV module to a threshold voltage required to inject sinusoidal currents into the grid. A DC to alternating current (AC) multilevel inverter is provided in the system to supply the power from the PV module to a power grid. The system also includes a bypass circuit to bypass the boost converter when an input voltage of the DC to AC multilevel inverter is higher than or equal to the threshold voltage.

18 Claims, 5 Drawing Sheets

SOLAR INVERTER AND CONTROL METHOD

BACKGROUND

This invention relates generally to electric energy conversion, and, more specifically, to efficient connection of a photovoltaic module to a power grid or a load.

With the rising cost and scarcity of conventional energy sources and concerns about the environment, there is a significant interest in alternative energy sources such as solar power and wind power. Solar power generation uses photovoltaic (PV) modules to generate electricity from the sun. Multiple PV cells are connected electrically to one another in such systems. The electricity generated by PV modules is transmitted to the power grid through one or multiple power electronic converters.

Power losses of the power electronic converters are an important issue in unit sizing of photovoltaic systems because of the influence of such losses on the total energy delivered to the load. The power losses occur in the converters mainly because of losses in switching devices such as Insulated Gate Bipolar Transistors (IGBTs), Metal Oxide Field Effect Transistors (MOSFETs) and diodes, which are generally used in the converters or passive components such as filter inductors. The switching devices generally have three major types of losses: conduction losses, switching losses and gate drive losses. Gate drive losses are not present in diodes, however, conduction losses and switching losses are very much part of the diode losses. Losses in fast switching diodes are typically higher than slow switching diodes. The switching losses correspond to the losses that occur during state changes of the switching device (during turn on and turn off). The conduction losses correspond to losses that occur in the switching device during its conduction (when the device is carrying a current). Gate drive losses refer to the energy required to charge and discharge gate-source and gate-drain capacitances of the switching devices and are affected by switching frequency, drain-source capacitance, and the voltage traversed. Filter inductor losses consist typically of copper and iron losses. Copper losses in power converters are typically increased by skin and proximity effects. Therefore, it is desirable to determine a method and a system that will address the foregoing issues.

BRIEF DESCRIPTION

In accordance with an exemplary embodiment of the present invention, a power generation system is provided. The system comprises a photovoltaic module for generating direct current (DC) power and a controller to determine a maximum power point for the power generation system. The system further includes a boost converter for receiving control signals from the controller to boost the power from the PV module to a threshold voltage required to inject sinusoidal currents into the grid and a DC to alternating current (AC) multilevel inverter to supply the power from the PV module to a power grid. A bypass circuit is also provided in the system to bypass the boost converter when an input voltage of the DC to AC multilevel inverter is higher than or equal to the threshold voltage.

In accordance with another exemplary embodiment of the present invention, a method for delivering solar power from a power generation system comprising a PV module is provided. The method includes determining a threshold voltage for generating sinusoidal currents for the power generation system and determining whether an output voltage of the PV module at maximum power production is higher than the threshold voltage. The method further includes boosting the power from the PV module to achieve the threshold voltage level when the output voltage of the PV module is less than the threshold voltage and converting the boosted power to AC power. The method also includes bypassing the boosting and directly converting the power from the PV module to AC power when the output voltage of the PV module is higher than the threshold voltage.

In accordance with yet another exemplary embodiment of the present invention, a method for controlling a power generation system is provided. The method includes controlling a stability of a center point of a direct current (DC) link using a boost converter when an output voltage of a PV module is less than a threshold voltage for generating sinusoidal currents for the power generation system. The method further includes controlling the stability of the center point using a DC to AC multi-level converter when the output voltage of the PV module is higher than the threshold voltage.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present invention function to provide a system and a method for efficient power transfer from a solar power generation system to a load or a power grid.

Figure 1:
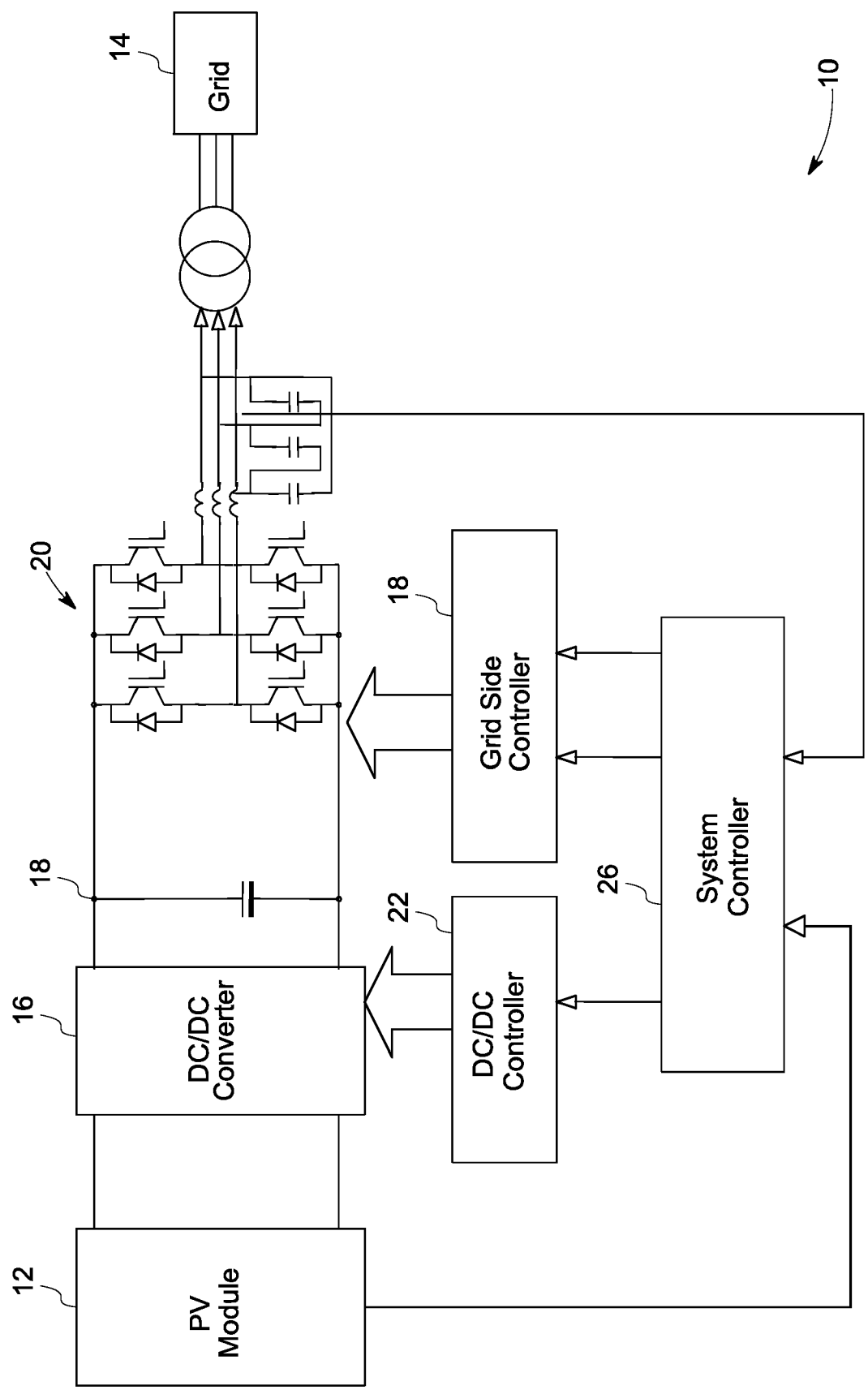
FIG. 1 is a diagrammatical representation of a conventional solar power generation system.

FIG. 1 illustrates a conventional solar power generation system 10. The power generation system includes a PV module 12. The PV module is connected to a power grid 14 through a DC/DC converter 16, a DC link 18 and a grid side three-phase DC/AC converter 20. The DC/AC converter 20 maintains a constant DC voltage at the DC link 18, and thus the energy flow from the DC-LINK 18 to the power grid 14 is managed. The DC/DC converter 16 is controlled by a controller 22, and the grid side converter 20 is controlled by a grid side controller 24. A system controller 26 generates a reference DC voltage command, a reference output voltage magnitude command, and a reference frequency command for the DC/DC converter 22 and grid side converter 20. In other systems, the grid side three-phase converter may be replaced by multiple single-phase converters and/or a single controller may be used for the multiple control functions shown in FIG. 1.

Figure 2:
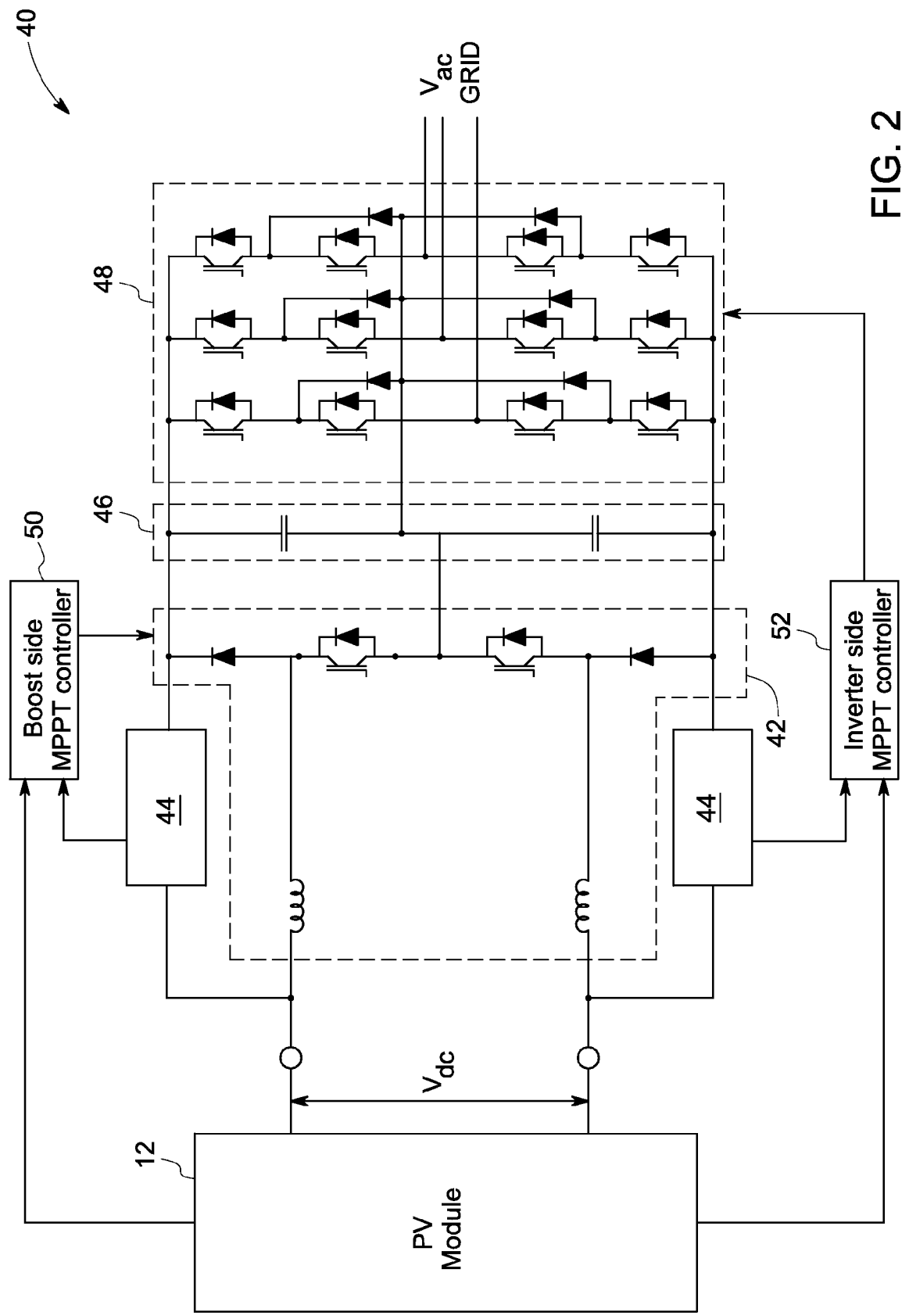
FIG. 2 is a diagrammatical representation of a solar power generation system in accordance with an embodiment of the present invention.

FIG. 2 illustrates a solar power generation system 40 in accordance with an embodiment of the present invention. In one embodiment, the system includes a PV module 12, a boost converter 42, a bypass circuit 44, a split DC link 46, a multilevel three phase inverter 48, a boost side maximum power point controller (MPPT) controller 50 and an inverter side MPPT controller 52. A grid voltage Vac generally determines the minimum DC link voltage. As long as the DC link voltage is higher than a threshold value or a threshold voltage, typically set by the maximum peak line-to-line voltage, the current injected into the grid by the multilevel inverter 48 will have a sinusoidal waveform. If the maximum power point operation of the PV module is associated with a voltage below the threshold voltage the boost side MPPT controller 50 is used to determine a maximum power point for the current-voltage (I-V) characteristics of the PV module and to provide a switching signal to the boost converter to operate the module close to that point at all times. Thus, the boost converter is used to raise the DC link voltage to make it at least equal to the threshold voltage so as to extract maximum power from the PV module.

In one embodiment, the MPPT controller 50 utilizes a perturbation and observation method. In the perturbation and observation method the current drawn from the solar array is perturbed and the power change is observed. If the perturbation results in an increase in power, the subsequent perturbation is made in the same direction and vice versa.

When the PV module voltage at maximum power output is higher than the threshold voltage needed for injecting a sinusoidal current into the grid, the bypass circuit 44 bypasses the boost converter. In other words, the boost converter is bypassed when the DC voltage at the photovoltaic (PV) module is higher than the minimum voltage at the split DC link. As the boost converter in the solar power generation system gets bypassed for certain duration of time, it improves the efficiency of the system by eliminating the losses in the boost converter and the boost inductor for that duration. In one embodiment, the bypass circuit comprises a power diode or a voltage controlled switch. In another embodiment, the power diode comprises a silicon carbide (SiC) diode to further improve efficiency of the solar power generation system. In one embodiment of the present solar power generation system, when the bypass circuit 44 bypasses the boost converter 42, the MPPT is operated on the multilevel inverter 48. The inverter side MPPT controller 52 senses the voltages and currents from the PV module and it also receives a signal from the bypass circuit 44 to determine when the circuit 44 is working. If the boost converter is bypassed the controller 52 provides switching command signals to the multilevel inverter 48 such that the multilevel inverter 48 will extract maximum power from the PV module. In one embodiment, the controllers 50 and 52 may be combined into a single controller.

Figure 3:
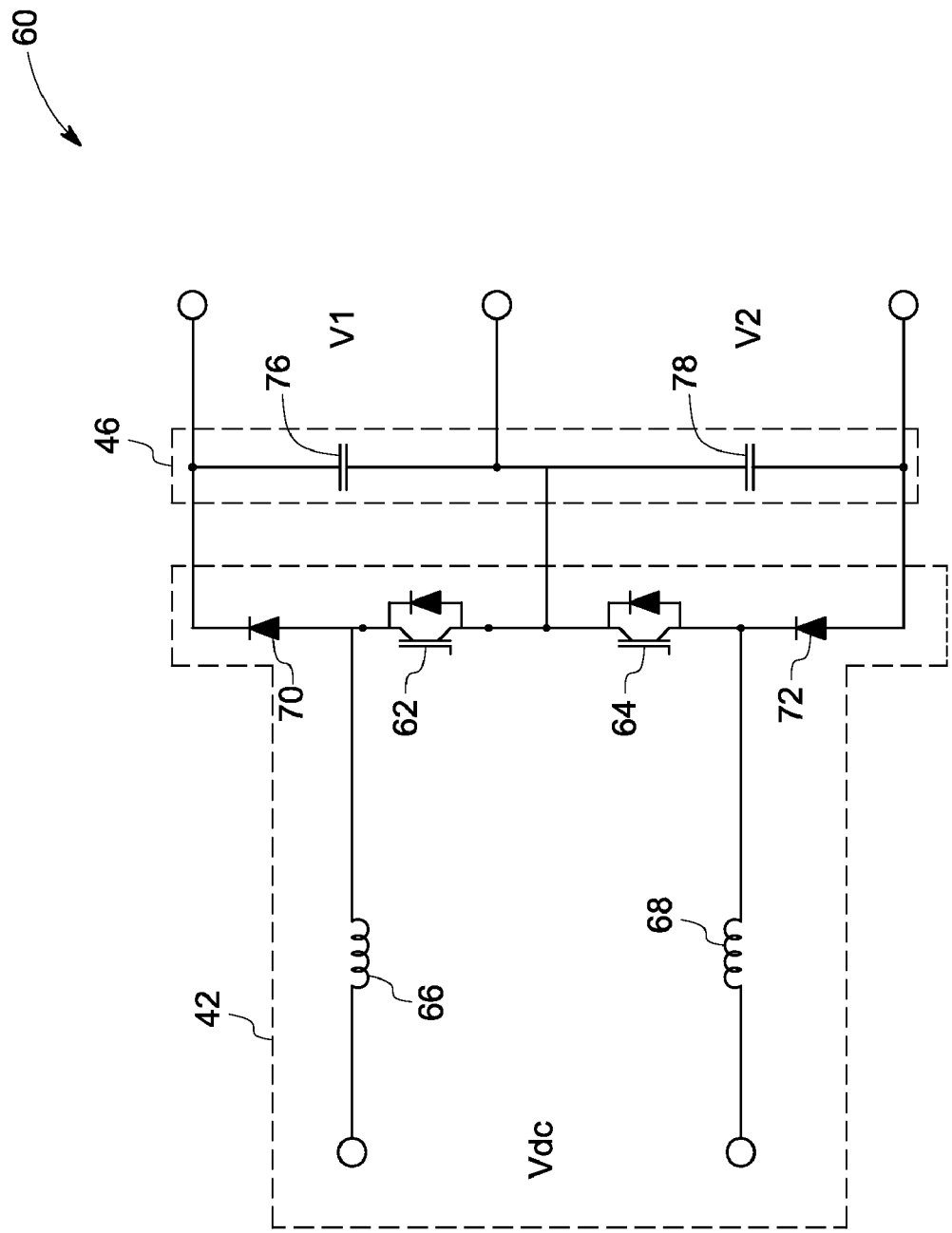
FIG. 3 is a schematic representation of a two inductor boost converter along with a split DC link in accordance with an embodiment of the present invention.

FIG. 3 illustrates a schematic 60 of a two inductor boost converter along with a split DC link in accordance with an embodiment of the present invention. The boost converter 42 includes switching devices 62, 64, the boost inductors 66, 68 and the diodes 70, 72 and 74. In one embodiment, the switching devices comprise insulated gate bipolar transistors (IGBTs) or power metal oxide semiconductor field effect transistors (MOSFETs). The switching devices are typically turned on and turned off by a gate drive circuit and in one embodiment comprise silicon carbide devices to improve the efficiency of the circuit. The split DC link 46 includes two capacitors 76 and 78. In operation, in one step, the switching devices 62 and 64 are turned on, which causes energy to be stored in the boost inductors 66 and 68. In another step, the switching device 62 is turned off while the switching device 64 is still on. This step results in charging of the capacitor 76 through the charging path formed by the boost inductor 66, the diode 70, the capacitor 76, the device 64 and the boost inductor 68. In yet another step, the switching device 64 is turned off while the device 62 is turned on. This results in charging of the capacitor 78 through the charging path formed by the boost inductor 66, the device 62, the capacitor 78, diode 72 and the boost inductor 68. When both the devices 62 and 64 are turned off, the capacitors 76 and 78 may get charged through the charging path formed by the boost inductor 66, the diode 70, capacitors 76, 78, the diode 72 and the boost inductor 68.

Figure 4:
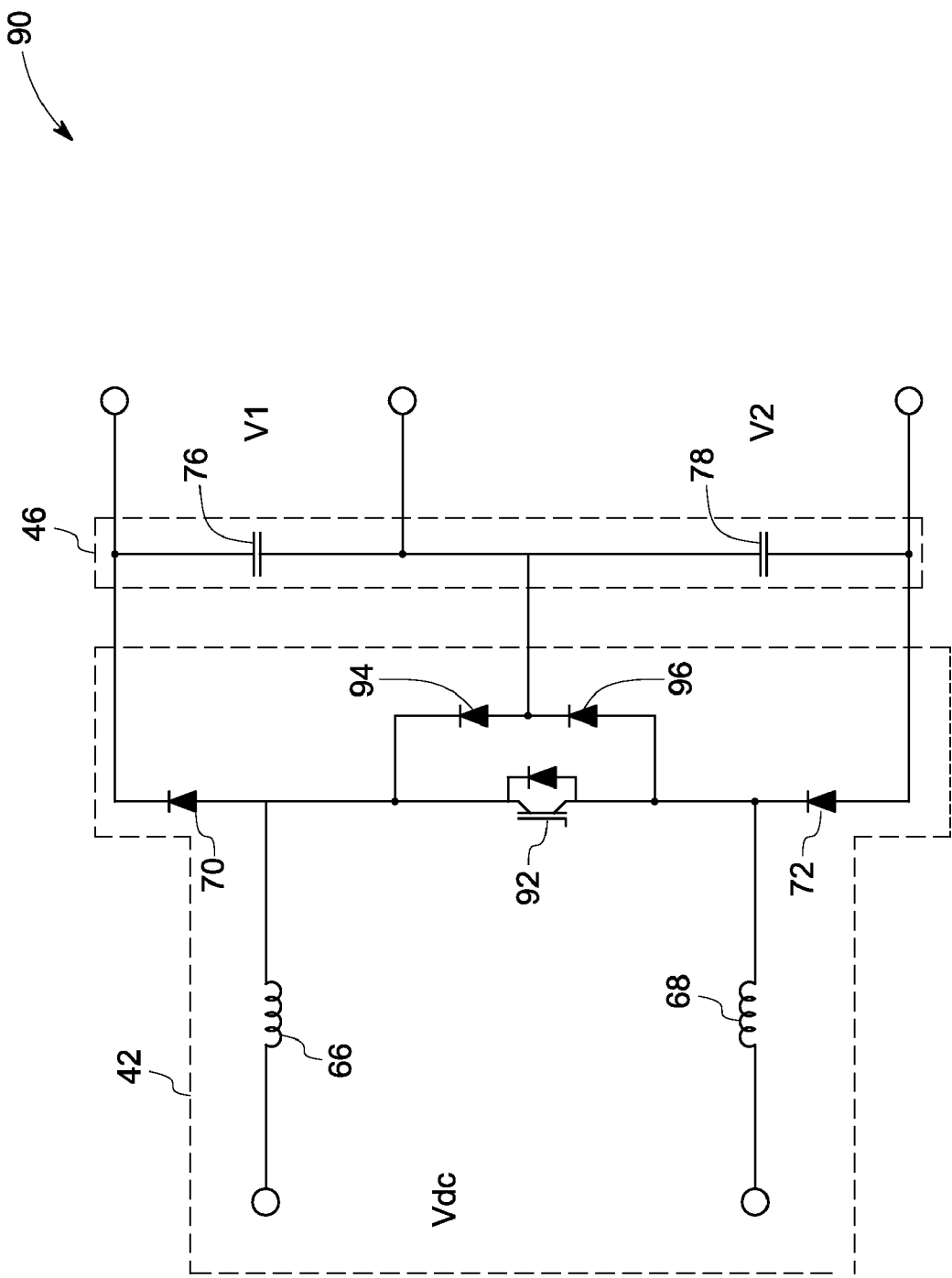
FIG. 4 is a schematic representation of another two inductor boost converter and a split DC link in accordance with an embodiment of the present invention.

FIG. 4 illustrates a schematic 90 of another two inductor boost converter and a split DC link in accordance with an embodiment of the present invention. In the embodiment of FIG. 4, a single switching device 92 is used along with two diodes 94 and 96 instead of two switching devices 62 and 64 as in the embodiment of FIG. 3. In operation, when the device 92 is turned on, the current flows from the boost inductor 66, the device 92 and the boost inductor 68. Thus, storing energy in the two inductors. During this time, the diodes 70 and 72 block the voltages V1 and V2 respectively. When the device 92 is turned off, the current flows from the boost inductor 66, the diode 70, capacitors 76 and 78, the diode 72 and the boost inductor 68. Thus, charging the capacitors 76 and 78.

Figure 5:
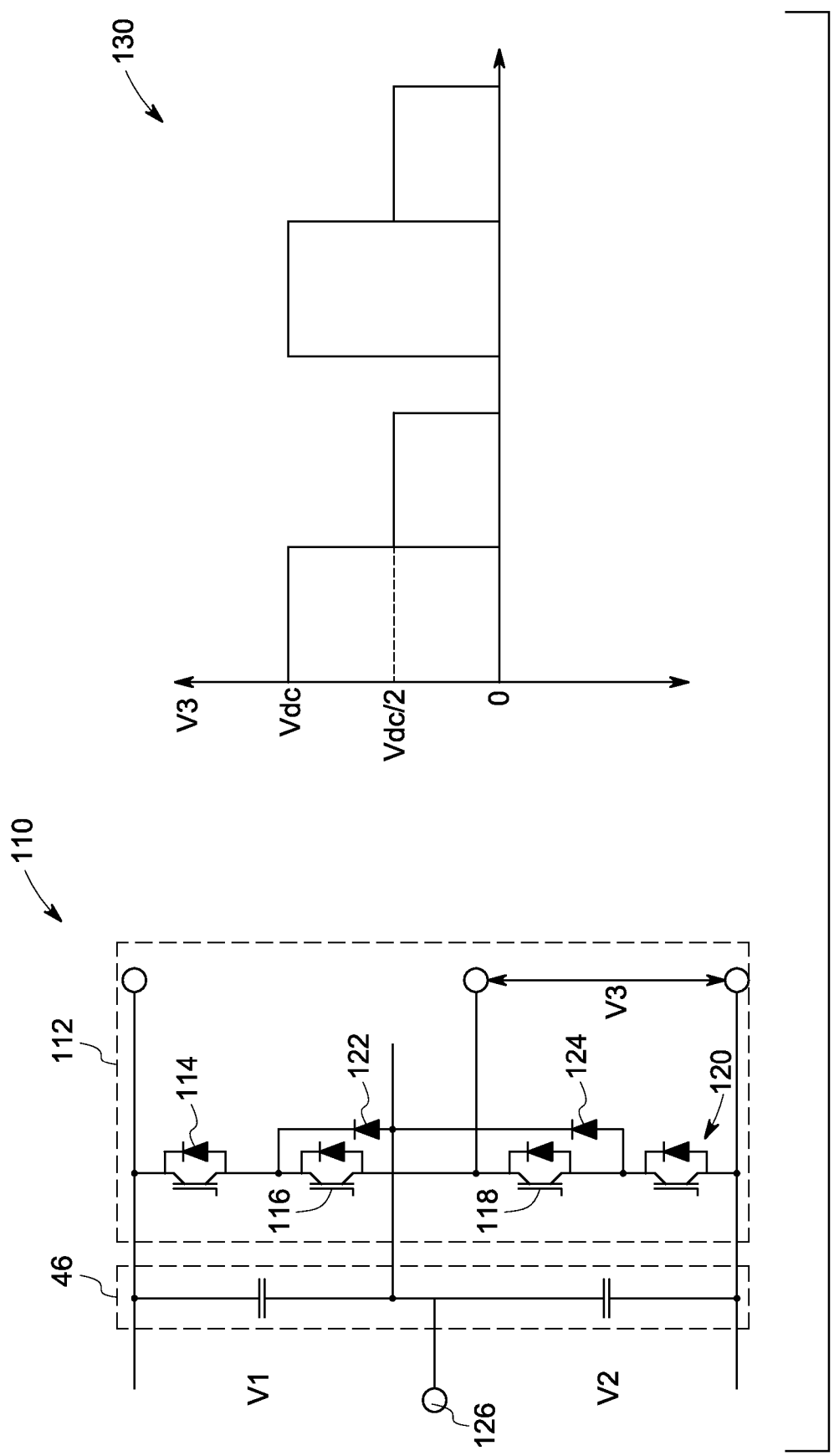
FIG. 5 is a diagrammatical representation of one leg of a diode clamped multilevel inverter and its output waveform in accordance with an embodiment of the present invention.

FIG. 5 illustrates a schematic 110 of one leg or one phase of a diode clamped multilevel inverter and its output waveform in accordance with an embodiment of the present invention. In one embodiment, the one leg 112 of the multilevel inverter includes four switching devices 114, 116, 118 and 120 and two diodes 122 and 124. The voltages V1 and V2 are controlled to maintain at Vdc/2 by the boost converter 42 of FIG. 3 or FIG. 4 and voltage V3 is the phase A voltage. Further the device 114 is complementary of device 118, i.e., when the device 114 is conducting, device 118 is not conducting and vice versa. Similarly, devices 116 and 120 are complementary of each other.

In operation, the one leg of the diode clamped multilevel inverter has three switching stages. In the first switching stage, the devices 114 and 116 are turned on and the devices 118 and 120 are turned off. Assuming a stable operation, V1=V2=Vdc/2, V3 becomes Vdc. In the second switching stage, devices 116 and 118 are turned on while devices 112 and 120 are turned off. In this stage, V3 is equal to Vdc/2. In this stage the output voltage is equal to a voltage at a center tap or a center point 126 of the multilevel converter. The center point 126 refers to a connection point between two DC link capacitors. In one embodiment, where there are more than two DC link capacitors, there may be more than one center point depending on number of DC link capacitors utilized. In operation depending on a load current supplied by the multi-level converter to the power grid, the center point voltage may not remain stable and hence voltage V1 and V2 may fluctuate from the value Vdc/2. In one embodiment, when an output voltage of the PV module is less than a threshold voltage, the stability of the center point is controlled by the boost converter; and when the output voltage of the PV module is higher than the threshold voltage, the stability of the center point is controlled by the multi-level converter.

In the third switching stage, devices 114 and 116 are turned on whereas devices 118 and 120 are turned off. This results in V3 becoming zero as shown in a waveform 130. Thus, it can be seen that the phase voltage V3 has three levels Vdc, Vdc/2 and 0. All three legs of the diode clamped three phase inverter are then combined and the resulting line voltages having five levels namely Vdc, Vdc/2, 0, −Vdc/2 and −Vdc are fed to the power grid as shown in FIG. 2. In another embodiment (not shown), the multilevel inverter may comprise a flying capacitor inverter comprising a ladder structure of DC capacitors or a cascaded H-bridge inverter, wherein various single phase inverters are connected in series. It will be appreciated by those skilled in the art that the three-level inverter 112 of FIG. 5 can be increased to any level depending on the circuit topology and thus depending on number of devices and diodes in the circuit. As the number of levels in the inverter increase, the output waveform of the inverter approaches a pure sine wave, resulting in lower harmonics in the output voltage.

The advantages of multilevel inverter are the dv/dt stresses on the passive devices, such as inductors, are reduced due to the small increment in voltage steps, reduced electromagnetic compatibility, smaller rating of switching devices and filter components and better feature of output voltage in term of less distortion, lower harmonics contents and lower switching losses.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power generation system comprising:
   a photovoltaic (PV) module to generate direct current (DC) power;
   a controller for determining a maximum power point for the power generation system;
   a boost converter comprising boost inductors, diodes, and switching devices for receiving control signals from the controller to boost the power from the PV module to a threshold voltage required to inject sinusoidal currents into the grid;
   a direct current (DC) to alternating current (AC) multilevel inverter to supply the power from the PV module to a power grid; and
   a bypass circuit for bypassing the boost inductors, diodes, and switching devices of the boost converter when an input voltage of the DC to AC multilevel inverter is higher than or equal to the threshold voltage.

2. The system of claim 1, wherein the controller is further configured to send MPPT control signals to the boost converter under normal operating conditions and to send MPPT control signals to the multilevel DC/AC inverter during bypass operating conditions.

3. The system of claim 1, wherein the boost converter comprises a two inductor boost converter.

4. The system of claim 1, wherein the boost converter comprises two diodes and two switching devices.

5. The system of claim 1, wherein the boost converter comprises one switching device and four diodes.

6. The system of claim 4, wherein the switching devices comprise an insulated gate bipolar transistor or a power metal oxide field effect transistor.

7. The system of claim 1, wherein an output stage of the boost converter comprises a split DC link.

8. The system of claim 7, wherein the split DC link is coupled between the boost converter and the multilevel inverter.

9. The system of claim 7, wherein the split DC link comprises two capacitors with a center tap in between.

10. The system of claim 9, wherein the two inductor boost converter controls a voltage at the center tap.

11. The system of claim 1, wherein the multilevel inverter is selected from a diode clamped multilevel inverter, a flying capacitor multilevel inverter and a cascaded H-bridge multilevel inverter.

12. The system of claim 1, wherein the multilevel inverter comprises a three level inverter.

13. The system of claim 1, wherein the bypass circuit comprises a power diode.

14. The system of claim 1, wherein the bypass circuit comprises two silicon carbide diodes.

15. The system of claim 1, wherein the multilevel inverter is configured to directly obtain maximum power from the PV module when the boost converter is bypassed.

16. A method of delivering solar power from a power generation system comprising a photovoltaic (PV) module, the method comprising:
   determining a threshold voltage for generating sinusoidal currents for the power generation system;
   determining whether an output voltage of the PV module at maximum power production is higher than the threshold voltage;
   when the output voltage of the PV module is less than the threshold voltage, boosting the power from the PV module to achieve the threshold voltage level via a boost converter comprising boost inductors, diodes, and switches and then converting the boosted power to alternating current (AC) power; and
   when the output voltage of the PV module is higher than the threshold voltage, bypassing the boost inductors, diodes, and switches of the boost converter and directly converting the power from the PV module to AC power.

17. The method of claim 16, further comprising, when the output voltage of the PV module is higher than the threshold voltage, using MPPT control signals when directly converting the power from the PV module to AC power.

18. The system of claim 1, wherein the bypass circuit comprises a voltage controlled switch.

* * * * *

UNITED STATES PATENT AND TRADEMARK OFFICE
CERTIFICATE OF CORRECTION

PATENT NO. : 8,184,460 B2  
APPLICATION NO. : 12/473700  
DATED : May 22, 2012  
INVENTOR(S) : O'Brien et al.

Page 1 of 1

It is certified that error appears in the above-identified patent and that said Letters Patent is hereby corrected as shown below:

In Column 1, Line 23, delete "Oxide" and insert -- Oxide Semiconductor --, therefor.

In Column 3, Line 4, delete "point controller" and insert -- point tracking --, therefor.

In Column 4, Line 42, delete "devices 112" and insert -- devices 114 --, therefor.

Signed and Sealed this
Seventeenth Day of July, 2012

David J. Kappos
*Director of the United States Patent and Trademark Office*